(12) United States Patent
Kasai et al.

(10) Patent No.: US 6,448,597 B1
(45) Date of Patent: Sep. 10, 2002

(54) DRAM HAVING A STACKED CAPACITOR AND A METHOD FOR FABRICATING THE SAME

(75) Inventors: Naoki Kasai; Toshihiro Iizuka, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/382,638

(22) Filed: Aug. 25, 1999

(30) Foreign Application Priority Data

Aug. 31, 1998 (JP) ............................................ 10-245236

(51) Int. Cl.⁷ .............................................. H01L 29/76
(52) U.S. Cl. ...................... 257/295; 257/296; 257/303; 257/306; 257/310; 438/239; 438/240; 438/253; 438/254; 438/396
(58) Field of Search ................................. 438/239, 240, 438/253, 254, 396; 257/295, 296, 303, 306, 310

(56) References Cited

U.S. PATENT DOCUMENTS

| | | | | |
|---|---|---|---|---|
| 5,053,917 A | * | 10/1991 | Miyasaka et al. | ........... 361/321 |
| 5,543,345 A | * | 8/1996 | Liaw et al. | .................... 437/52 |
| 5,652,165 A | * | 7/1997 | Lu et al. | ........................ 437/52 |
| 5,733,808 A | * | 3/1998 | Tseng | ......................... 438/239 |
| 5,793,076 A | * | 8/1998 | Fazan et al. | ................. 257/298 |
| 6,156,608 A | * | 12/2000 | Chen | ........................... 438/253 |

FOREIGN PATENT DOCUMENTS

| | | |
|---|---|---|
| JP | H8-222712 | 8/1996 |
| JP | H10-93041 | 4/1998 |

* cited by examiner

*Primary Examiner*—Caridad Everhart
*Assistant Examiner*—Belur V Keshavan
(74) *Attorney, Agent, or Firm*—Sughrue Mion, PLLC

(57) ABSTRACT

A DRAM includes a MOSFET and a stacked capacitor in each memory cell. The stacked capacitor includes a bottom electrode substantially of a cylindrical shape, a top electrode received in the cylindrical-shape bottom electrode, and a capacitor dielectric film for insulation therebetween. The cylindrical shape of the bottom electrode allows a larger deviation for alignment between the capacitor and the capacitor contact.

11 Claims, 13 Drawing Sheets

UNIT CELL : $2F_P \times 4F_P = 8F_P^2 = 8(F+M)^2$

UNIT CELL : $2F_P \times 4F_P = 8F_P^2 = 8(F+M)^2$

DRAM HAVING A STACKED CAPACITOR AND A METHOD FOR FABRICATING THE SAME

BACKGROUND OF THE INVENTION (a) Field of the Invention

The present invention relates to a DRAM (dynamic random access memory) having a stacked capacitor in each memory cell and a method for fabricating such a DRAM.

(b) Description of the Related Art

At the developing stage of DRAMs where the degree of integration is relatively low, the stacked capacitor disposed in each memory cell of the DRAM is generally formed by a top electrode made of polycrystalline silicon (polysilicon), a bottom electrode made of polysilicon and a capacitor dielectric film interposed therebetween and made of silicon oxide or a three-layer structure (ONO film) including silicon oxide layer/silicon nitride layer/silicon oxide layer.

With the development of higher integration and finer patterning in the DRAMs, the stacked capacitor as well as the MOSFETs should be subjected to a finer patterning process. In a 256 mega-bit (Mb) DRAM, or of higher integration, for example, the capacitor dielectric film should have a thickness lower than 4 nm when a silicon oxide film or ONO film having a relatively low permittivity (dielectric constant) is used in the stacked capacitor. However, it is quite difficult or substantially impossible to achieve such a smaller thickness in the silicon oxide film or ONO film from the technical view point, such as suppression of leakage current through the thin capacitor dielectric film. Thus, it is desired to make the stacked capacitor to be smaller and have a higher capacity by using a $(Ba, Sr)TiO_3$ film (BST film) having a higher dielectric constant as the capacitor dielectric film and by using a oxidation-resistant conductor as the bottom electrode.

Figure 1:
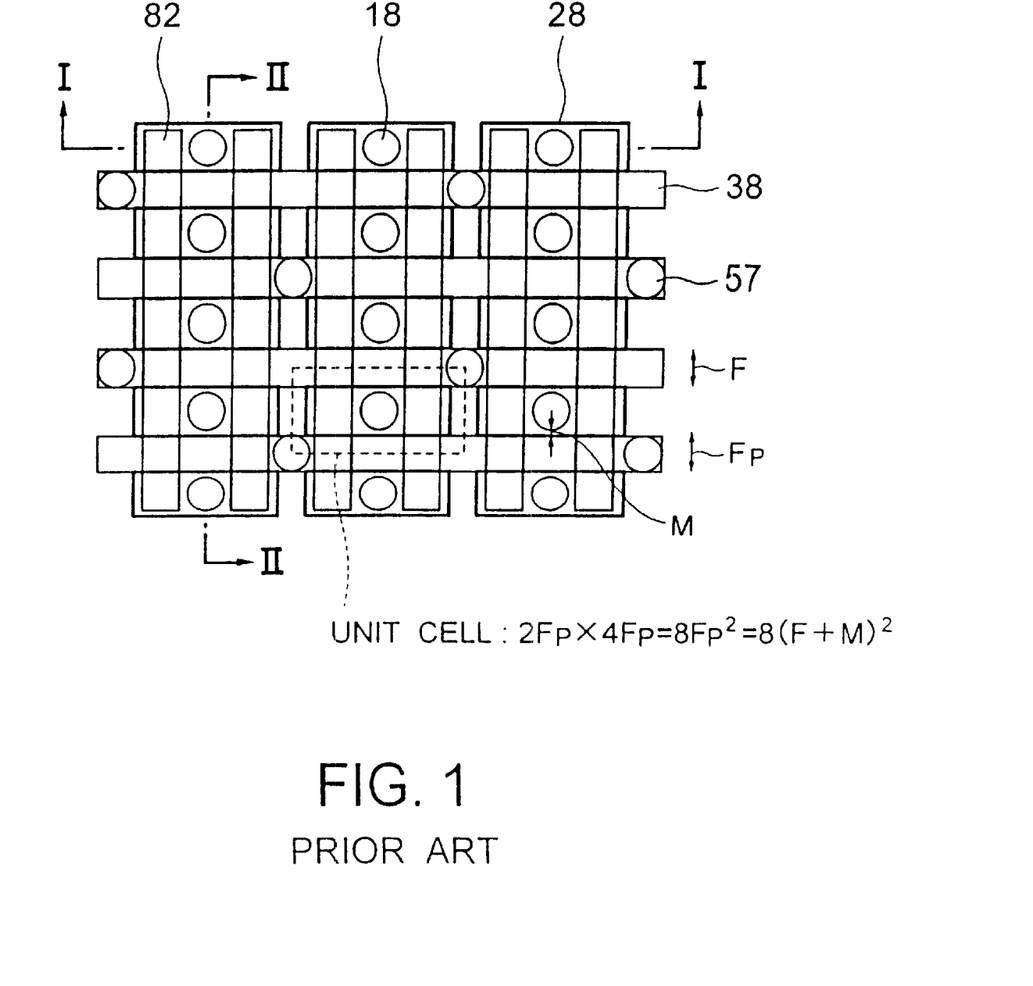
FIG. 1 is a top plan view of a conventional DRAM having a stacked capacitor.
Figure 2:
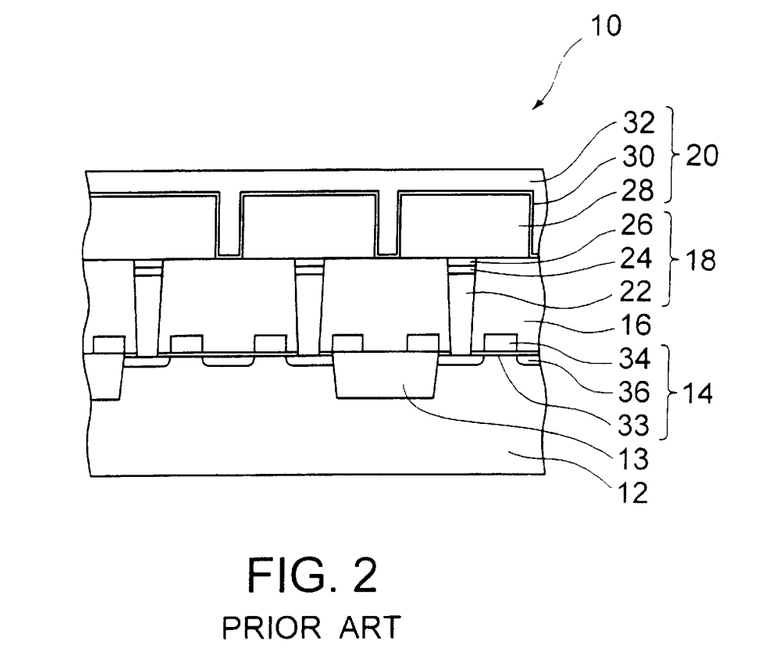
FIG. 2 is a cross-sectional view of the DRAM of FIG. 1 taken along line A—A in FIG. 1.
Figure 3:
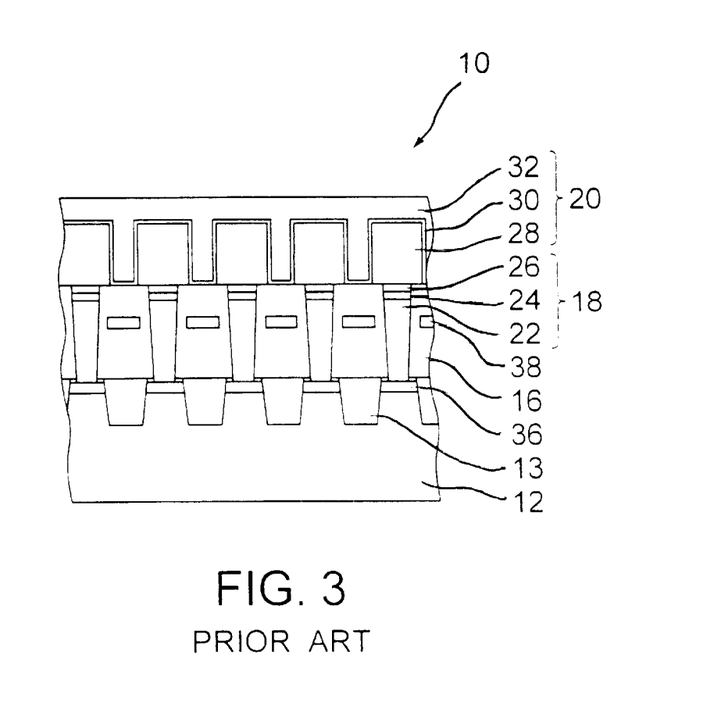
FIG. 3 is a cross-sectional view of the DRAM of FIG. 1 taken along line B—B in FIG. 1.

FIG. 1 shows the memory cell array of a DRAM, wherein a plurality of word lines 82 extend in a row direction, and a plurality of bit lines 38 extend in a column direction. Each word line 82 is connected to the gates of MOSFETs of a corresponding row of memory cells, whereas each bit line 38 is connected to the diffused regions of MOSFETs of a corresponding column of memory cells. A plurality of capacitor contacts 18 are disposed between adjacent word lines 82 for connecting bottom electrodes with the diffused regions of corresponding MOSFETs, whereas a plurality of bit contacts 57 are aligned with the bit lines 38 between adjacent bottom electrodes 28 for connecting the diffused regions of the MOSFETs 14 and the bit lines 38. The area encircled by a dotted line corresponds to a unit memory cell, which occupies an area of $8\times(F+M)^2$, wherein F is the minimum design width of the word lines 82 and the bit lines 38 and M is a design margin for patterning. In the current photolithographic technique, M is generally above 0.05 $\mu$m for F=0.18 $\mu$m FIGS. 2 and 3 are cross-sectional views taken along lines A—A and B—B, respectively, in FIG. 1. The conventional DRAM 10 includes a p-type silicon substrate 12, a plurality of MOSFETs 14 each disposed in an isolated region of the silicon substrate 12 isolated from another isolated region by a field oxide film 13, a dielectric film 16 made of $SiO_2$ etc. covering the MOSFETs 14, a stacked capacitor 20 disposed above the MOSFET 14 and having a top electrode 32, a bottom electrode 28 and a capacitor dielectric film 30, a capacitor contact 18 disposed in a via hole for connecting the bottom electrode 28 and the diffused region 36 of the MOSFET 14 in each memory cell.

The capacitor contact 18 includes polysilicon plug 22 disposed on the diffused region 36 in a via hole, and a silicide contact layer 24 and a silicon-diffusion-resistant conductive layer 26 consecutively disposed on top of the polysilicon plug 22. The silicon-diffusion-resistant conductive layer 26 includes a high-melting-point metal (refractory metal) or its nitride TiN or WN of such a metal, and is disposed for prevention of formation of a silicide metal between the metallic bottom electrode 28 and the capacitor contact 18. The silicide contact layer 24 is made of $TiSi_2$, for example, which improves adhesion and reduces the contact resistance between the silicon-diffusion-resistant conductive layer 26 and the polysilicon plug 22.

The bottom electrode 28 of the capacitor 20 is made of a solid conductor made of oxidation-resistant conductive material, such as a noble metal (Pt etc.), Ru or a metal oxide such as $RuO_2$, the capacitor dielectric film 30 is made of BST having a high dielectric constant, and the top electrode 32 is made of the metal same as the metal of the bottom electrode 28.

The MOSFET 14 has a gate electrode 34 formed on the gate oxide film 33, and a pair of n-type diffused regions 36 implementing source/drain regions and sandwiching the gate electrode 34 therebetween as viewed in the vertical direction. Bit lines 38 are shown in FIG. 3 within the $SiO_2$ film 16 having via holes receiving therein the capacitor contacts 18. The bottom electrode 28 of the stacked capacitor 20 is connected to the diffused region 36 of the MOSFET 14 through the capacitor contact 18.

Figure 4A:
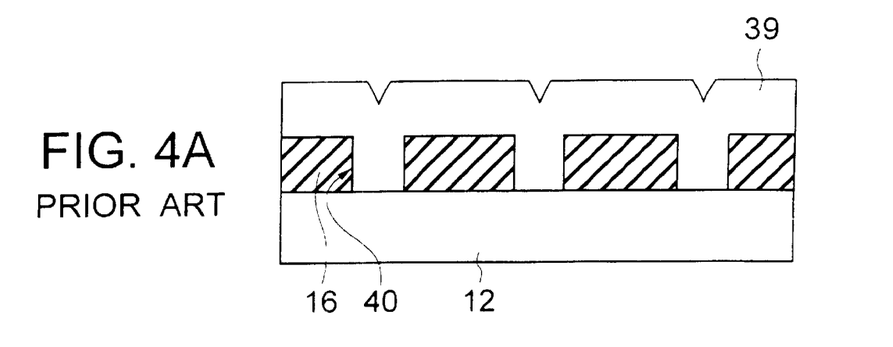
FIGS. 4A to 4H are cross-sectional views of the DRAM of FIG. 1 for showing consecutive steps of fabrication thereof.

Referring to FIGS. 4A to 4H, there are shown cross-sections of the DRAM of FIG. 1 for illustrating consecutive steps of fabrication of the stacked capacitor. As shown in FIG. 4A, after MOSFETs are formed on a silicon substrate 12, a dielectric film 16 made of $SiO_2$ is deposited by a CVD technique, followed by formation of via holes 40 therein. A polysilicon film 39 is then deposited by a CVD technique, followed by ion-implantation of phosphorous ions thereto to reduce the resistivity of the polysilicon film 39.

Figure 4B:
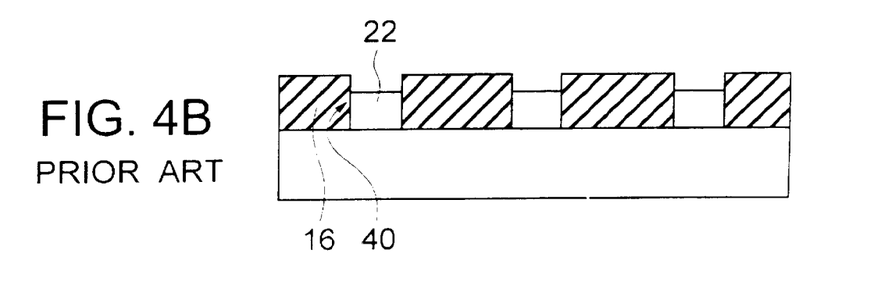

Thereafter, as shown in FIG. 4B, the polysilicon film 39 is subjected to an etch-back step to expose the top of the dielectric film 16, and also subjected to over-etch to remove the top portion of the polysilicon film 39 in the via holes 40, thereby leaving the polysilicon plug 22 in the via holes 40.

Figure 4C:
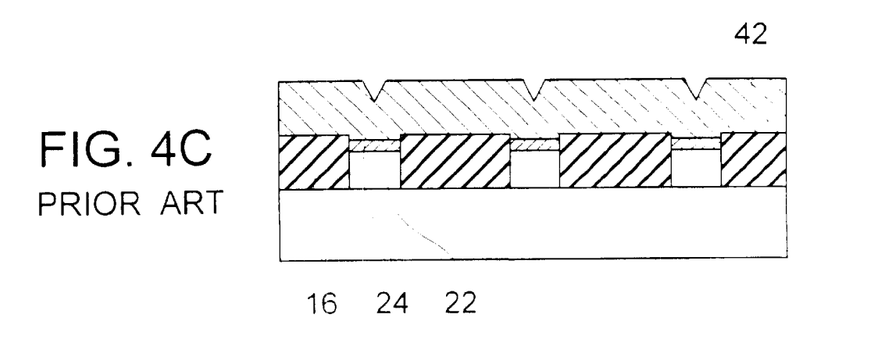
Figure 4D:
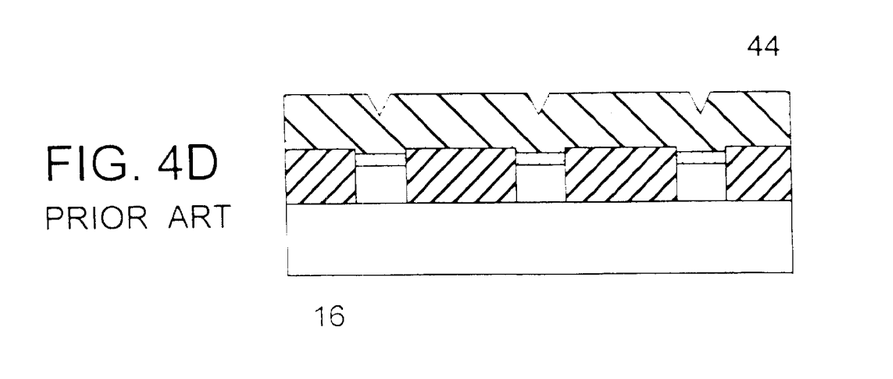
Figure 4E:
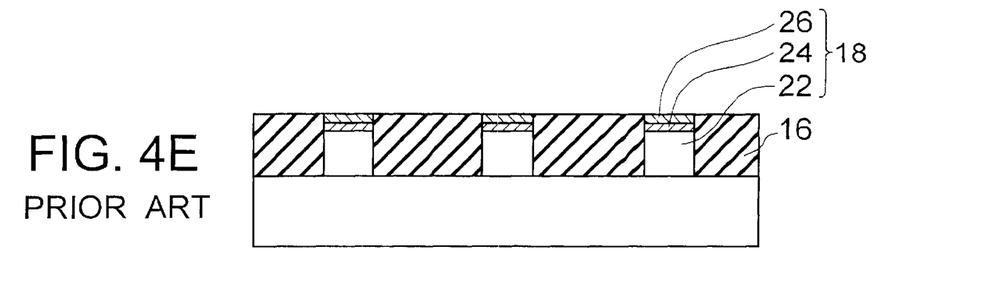

Subsequently, as shown in FIG. 4C, a Ti film 42 is deposited on the entire surface including the top of the polysilicon plug 22 by sputtering, followed by rapid thermal annealing (RTA) in a nitrogen ambient, thereby forming a silicide contact layer 24 made of TiSi on the top of the polysilicon plug 22. After removing the unreacted Ti on the dielectric film 16 and in the via holes 40 to expose the dielectric film 16 and the TiSi film 24, a TiN film 44 is deposited on the TiSi film 24 and the dielectric film 16 by a CVD technique or a sputtering technique.

The TiN film 44 is then subjected to a chemical-mechanical polishing (CMP) process using colloidal silica, thereby exposing the dielectric film 16 and achieving the capacitor contact 18 including the silicon-diffusion-resistant conductive layer 26, TiSi contact layer 24 and polysilicon plug 22 in the via hole 40.

Figure 4F:
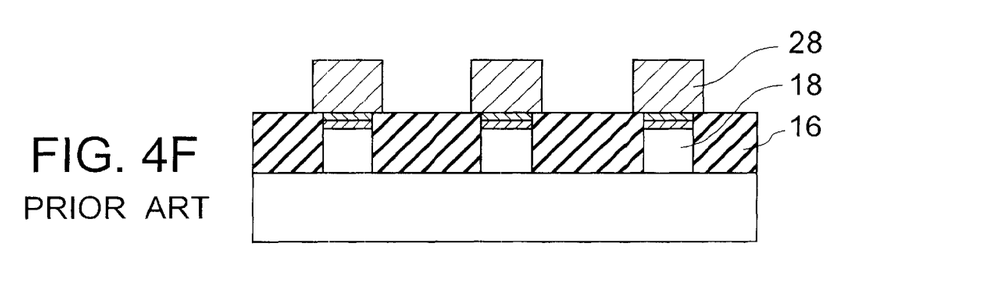
Figure 4G:
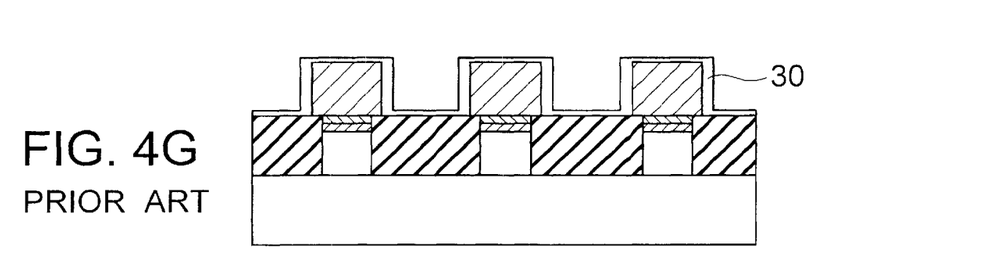
Figure 4H:
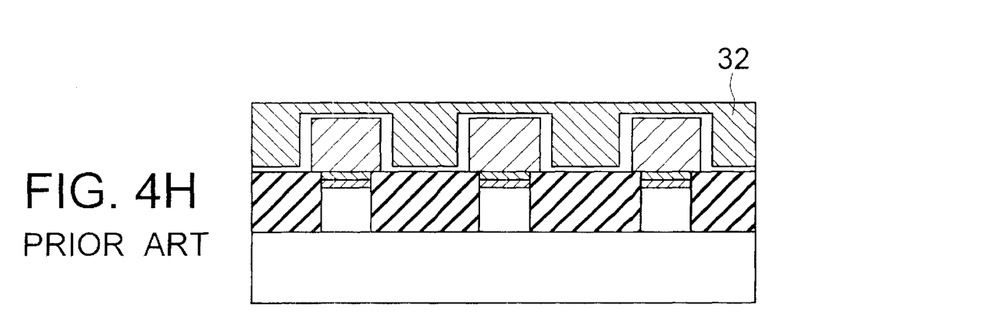

Thereafter, a Ru film is deposited on the dielectric film 16 and the capacitor contacts 18 by using a reactive DC sputtering process, followed by selective etching thereof to form a bottom electrode 28 on top of the capacitor contact 18 by a plasma etching technique using an etching mask and a mixed gas of chlorine and oxygen. The bottom electrode 28 is solid and of a block-like shape, as shown in FIG. 4F.

Next, a MOCVD process using Ba(DPM)$_2$, Sr(DPM)$_2$, Ti(i-OC$_3$H$_7$) and oxygen is conducted to form an about 30-nm-thick BST film as a capacitor dielectric film 30 on the entire surface of the substrate. "DMP" as used herein means bis-dipivaloylmethanate. In this step, the substrate temperature is maintained between 400 and 700 °C., with the gas pressure maintained at about 7 mTorr.

Then, another Ru film is deposited on the BST film by using a reactive DC sputtering to thereby form a top electrode 32. Thus, a DRAM 10 of FIG. 1 including a stacked capacitor having a BST film as the capacitor dielectric film 30 is obtained.

In the conventional DRAM as described above, the bottom electrode 28 should be patterned so that the bottom electrode 28 covers the top of the capacitor contact 18 in order that the BST film implemented as the capacitor dielectric film 30 do not contact with the capacitor contact 18. The reason therefor will be further described with reference to FIGS. 5 and 6.

Figure 5:
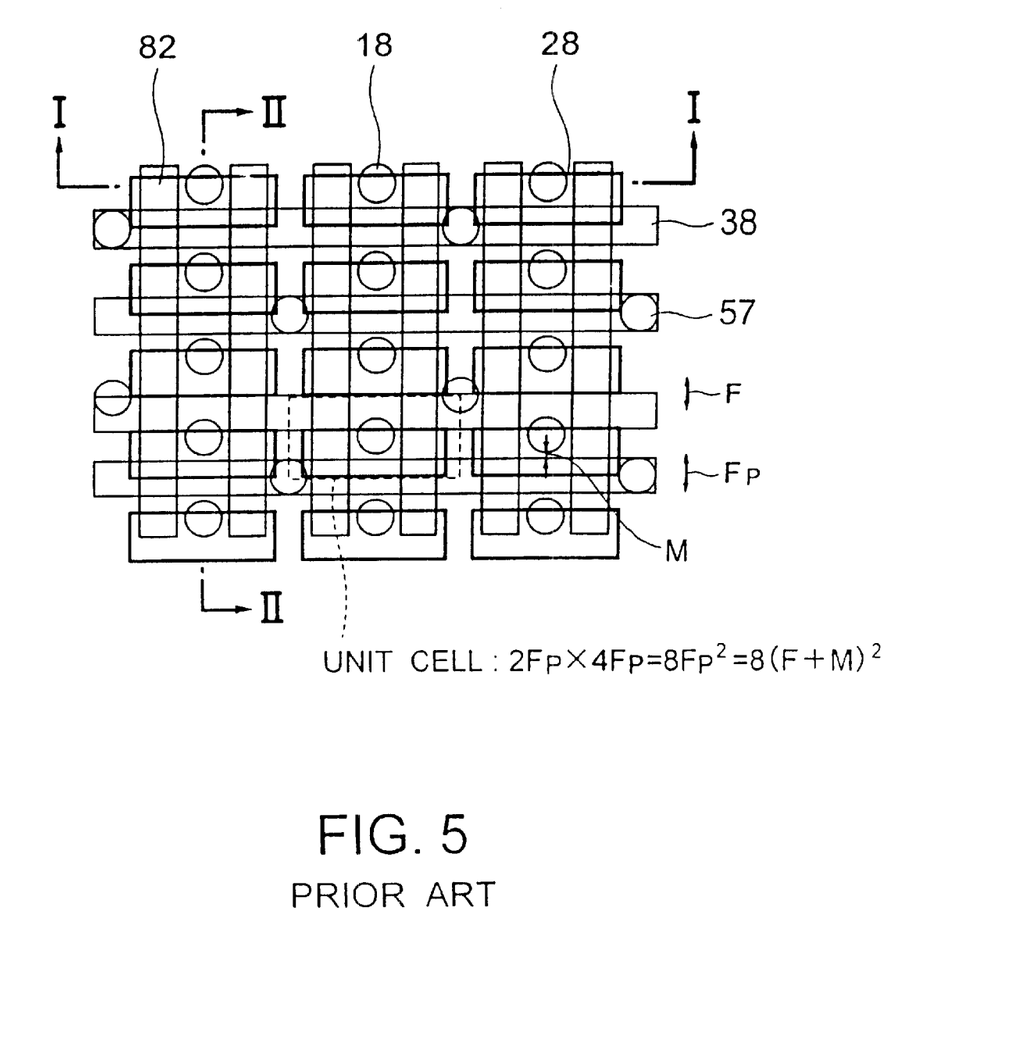
FIG. 5 is a top plan view of a DRAM for showing a problem upon occurrence of deviation of a bottom electrode with respect to the capacitor contact.
Figure 6:
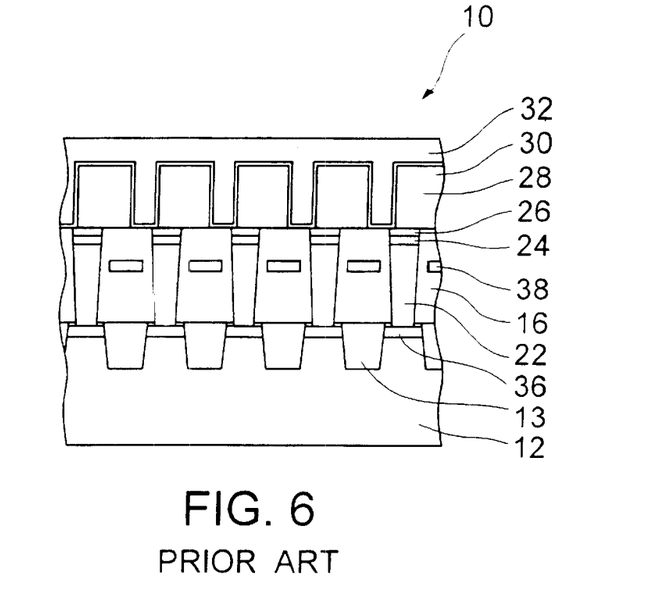
FIG. 6 is a cross-sectional view of the DRAM of FIG. 5 taken along line A—A in FIG. 5.

In FIGS. 5 and 6 showing the top plan view and cross-sectional view, respectively, of the DRAM 10, if the bottom electrode 28 misaligns to the top of the capacitor contact 18 to expose the silicon-diffusion-resistant conductive layer 26, the silicon-diffusion-resistant conductive layer 26 is subjected to oxidation due to the oxidizing ambient during deposition of the BST film 30, whereby the electric resistance of the silicon-diffusion-resistant conductive layer 26 increases.

For prevention of the surface of the silicon-diffusion-resistant conductive layer 26 from being exposed, the bottom electrode 28 must be aligned with the location of the capacitor contact 18. This necessitates a larger design margin for the etching mask used for patterning the bottom electrode 28. In FIG. 5, the area of the unit cell or memory cell is expressed by 2Fp×4Fp wherein Fp is a half of the pitch of the bit lines and Fp=(F+M), F and M being the minimum design width of the lines (or minimum design rule) and the design margin for alignment, respectively. Thus, the area of the unit memory cell, which is expressed by 2Fp×4Fp=8×(F+M)$^2$ as shown in FIG. 5 increases with the increase of the design margin.

Figure 7:
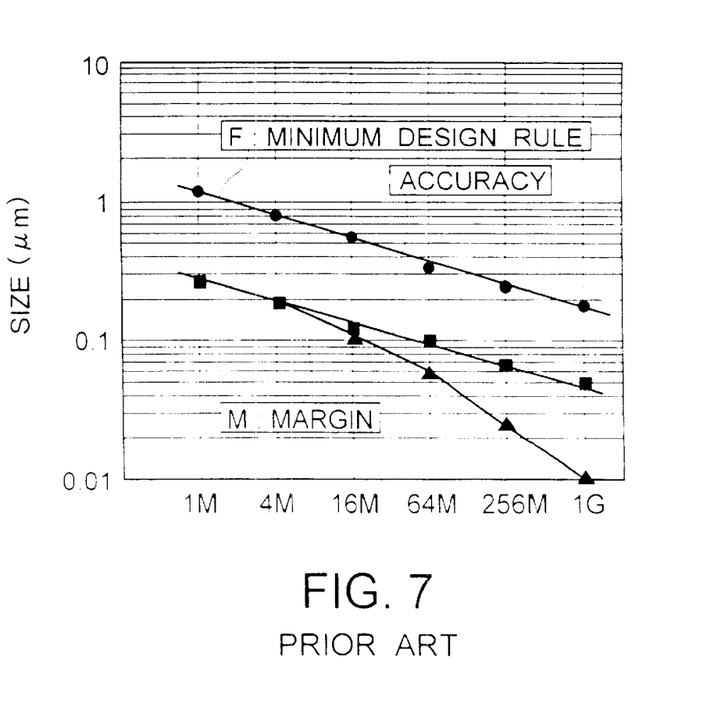
FIG. 7 is a graph for showing design sizes plotted against the generations of DRAMs.

FIG. 7 shows design sizes of the DRAMs plotted against the generations of the DRAMs. With higher integration of the DRAMs, the minimum design rule F and the design margin M decrease, with the required accuracy for alignment being also reduced in terms of size ($\mu$m). In this situation, the current fabrication technique does not match the higher integration of the DRAMs. The accuracy of the alignment is especially required in the direction normal to the longitudinal direction of the bottom electrode 28.

The above situation is similar to DRAMs having a capacitor dielectric film made of other than the BST film, although the conventional DRAM having a BST film is exemplarily described herein.

SUMMARY OF THE INVENTION

It is therefore an object of the present invention to provide a DRAM having a stacked capacitor, which is capable of being fabricated with a simplified process and with a finer design rule.

It is another object of the present invention to provide a method for fabricating the DRAM as described above.

The present invention provides a DRAM including a plurality of memory cells each including a MOSFET having a gate electrode and a pair of diffused regions, a stacked capacitor having a bottom electrode of a cylindrical shape, a top electrode, at least a portion of the top electrode being received in the bottom electrode, and a capacitor dielectric film sandwiched between the top electrode and the bottom electrode, and a capacitor contact for connecting one of the diffused regions to the bottom electrode, The present invention also provides a method for manufacturing a DRAM including the steps of:
   forming a MOSFET having a gate and a pair of diffused regions in an isolated region of a silicon substrate;
   forming a first dielectric film covering the MOSFET and having a via hole receiving therein a capacitor contact in contact with one of the diffused regions;
   forming, on the first dielectric film, a second dielectric film including an opening having a bottom exposing a top of the capacitor contact; forming a capacitor having a bottom electrode in contact with the capacitor contact in the opening of the second dielectric film.

In accordance with the DRAM of the present invention, the cylindrical shape of the bottom electrode allows a larger deviation of alignment between the capacitor and the capacitor contact with a smaller design margin, thereby facilitating simplified process for fabrication of the DRAM and improving the yield of the DRAMs. The cylindrical shape as used herein is not limited to the shape which has a circular cross-section and may have a any cross-section such as a rectangular cross-section.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings, wherein similar constituent elements are designated by similar reference numerals.

Figure 8:
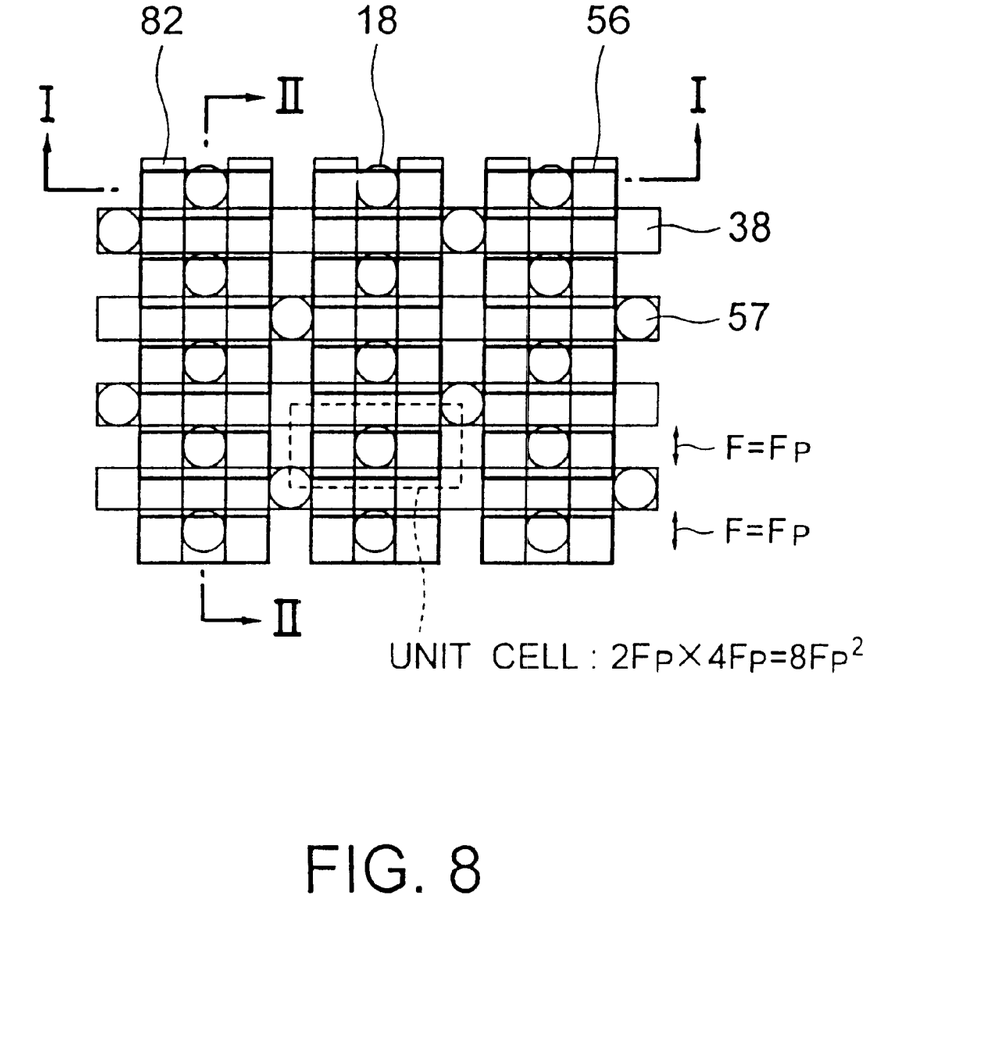
FIG. 8 is a top plan view of a DRAM according to a first embodiment of the present invention.

Referring to FIG. 8, a DRAM, generally designated by numeral 50, according to a first embodiment of the present invention has a configuration wherein a plurality of word lines 82 extend in a row direction, and a plurality of bit lines 38 extend in a column direction. Each word line 82 is connected to the gates of MOSFETs of a corresponding row of the memory cells, whereas each bit line 38 is connected to the diffused regions 36 of MOSFETs of a corresponding column of the memory cells. A plurality of capacitor contacts 18 are disposed between a pair of word lines 82 for connecting a bottom electrode 56 with the diffused regions of the corresponding MOSFETs, whereas a plurality of bit contacts 57 are disposed substantially aligned with the bit is lines 38 between adjacent bottom electrodes 56 for connecting the diffused regions 36 of the MOSFETs and the bit lines 38. The area encircled by a dotted line corresponds to a unit memory cell, which occupies an area equal to $8 \times (F+M)^2$ wherein "F" is the minimum design width of the word lines 82 and the bit lines 38, and M is the design margin.

Figure 9:
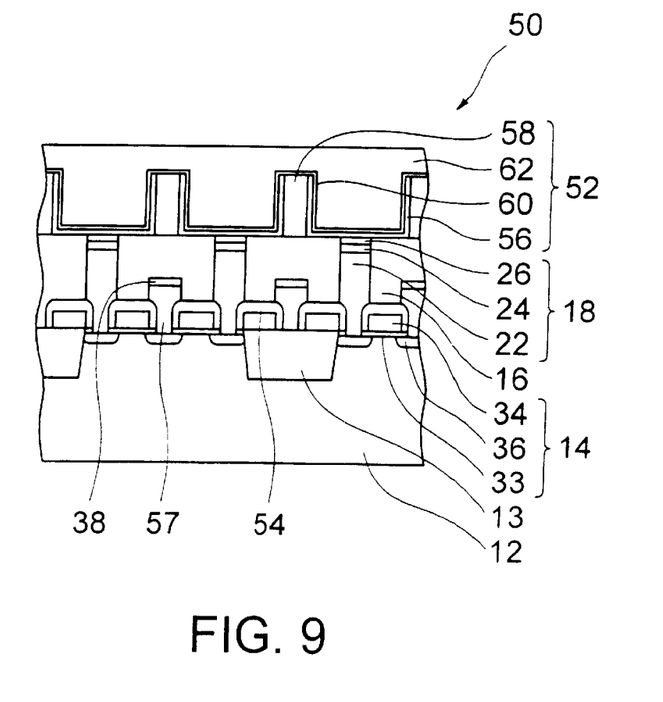
FIG. 9 is a cross-sectional view of the DRAM of FIG. 8 taken along line A—A in FIG. 8.
Figure 10:
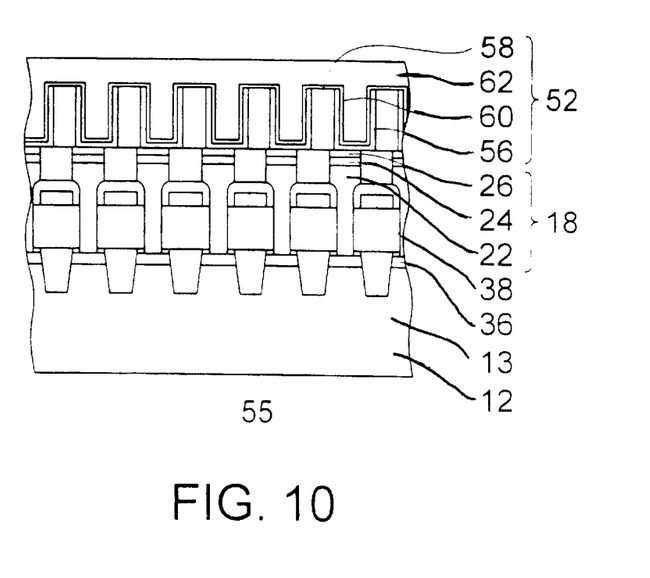
FIG. 10 is a cross-sectional view of the DRAM of FIG. 8 taken along line B—B in FIG. 8.

FIGS. 9 and 10 are cross-sectional views taken along lines A—A and B—B, respectively, in FIG. 8. The DRAM 50 includes a p-type silicon substrate 12, a plurality of MOSFETs 14 each disposed in an isolated region of the silicon substrate 12 isolated from another isolated region by a field oxide film 13, a dielectric film 16 made of $SiO_2$ etc. covering the MOSFETs 14, a stacked capacitor 52 disposed above the MOSFET 14 and having a top electrode 62, the bottom electrode 56 and a capacitor dielectric film 60 sandwiched therebetween, the capacitor contact 18 disposed in a via hole for connecting the bottom electrode 56 and the diffused region 36 of the MOSFET 14 in each memory cell.

The stacked capacitor 52 is disposed above the capacitor contact 18 and includes bottom electrode 56, the capacitor dielectric film 60 formed on the bottom electrode 56, and the top electrode 62 formed on the capacitor dielectric film 60. The capacitor contact 18 includes polysilicon plug 22 disposed on the diffused region 36 in a via hole, and a 30-nm-thick silicide contact layer 24 and a 40-nm-thick silicon-diffusion resistant conductive layer 26, which are consecutively disposed on top of the polysilicon plug 22. The silicon-diffusion resistant conductive layer 26 includes TiN for prevention of formation of a silicide metal between the metallic bottom electrode 56 and the silicon contact 24. The silicide contact layer 24 is made of $TiSi_2$, which improves adhesion and reduces the contact resistance between the silicon-resistant diffused contact layer 26 and the polysilicon plug 22. An interlayer silicon oxide film 58 isolates adjacent bottom electrodes 56 from each other in the horizontal direction.

The bottom electrode 56 of the capacitor 52 is made of a solid metal or metal oxide such as a noble metal (Pt), Ru or $RuO_2$, the capacitor dielectric film 60 is made of BST having a high dielectric constant, and the top electrode 62 is made of the metal same as the metal of the bottom electrode 56.

The MOSFET 14 has a gate electrode 34 formed on a gate oxide film 33, and a pair of n-type diffused regions 36 implementing source/drain regions and sandwiching the gate electrode 34 therebetween as viewed in the vertical direction. Bit lines 38 are shown in FIG. 10 extending within the $SiO_2$ film 16 having via holes receiving therein the capacitor contacts 18. The capacitor 52 is connected to the diffused region 36 of the MOSFET through the capacitor contact 18.

In the above configuration, the DRAM 50 of the present embodiment is similar to the conventional DRAM 10 except for the configurations of the gate electrode 34 and the capacitor 52.

In the DRAM of the present embodiment, the alignment accuracy between the capacitor contact 18 and the bottom electrode 56 can be mitigated, as illustrated in FIG. 8, compared to the conventional DRAM.

In the DRAM of the present embodiment, the line width for the word lines 82 and the bit lines 38 is 0.18 $\mu$m, the diameter of the capacitor contact 18 and the bit contact 57 is 0.18 $\mu$m, and the bottom electrode 56 is of a rectangular planar shape having sides of 0.28 $\mu$m×0.68 $\mu$m, for example.

The MOSFET 14 is similar to the MOSFET in the conventional DRAM except for a 50-nm-thick silicon nitride film 54 formed on the gate electrode 34. The bit line 38 is connected to the n-type diffused regions 36 of the MOSFETs 14 through the bit contacts 57, and a 50-nm-thick silicon nitride ($Si_3N_4$) film 55 is formed on the bit lines 38.

The bottom electrode 56 has a cylindrical shape having a closed bottom, closed side walls and an open top, and receives therein the top electrode 60. The interlayer silicon oxide film 58 separates adjacent bottom electrodes 56 from each other. The capacitor dielectric film 60 is disposed on the bottom electrode 56 and the interlayer silicon oxide film 58. The bottom electrode 56 has a longer side in the direction parallel to the bit lines 38 and normal to the word lines 82.

The capacitor dielectric film 60 is implemented by a 20-nm-thick BST film, the bottom electrode 56 is implemented by a 30-nm-thick oxidation-resistant metal oxide made of noble metal such as Pt, or Ru, Ir etc., and the top electrode 62 is of a block shape implemented by a 400-nm-thick oxidation-resistant metal or metal oxide which may be same as the metal or metal oxide of the bottom electrode 56.

In the present embodiment, even if the stacked capacitor 52 is mis-aligned to some extent with the capacitor contact 18, as shown in FIG. 10, the BST film 60 does not contact with the capacitor contact 18 due to the presence of the bottom electrode 56 and the interlayer oxide film 58. It is sufficient that both the bottom electrode 56 and the capacitor contact 18 are in contact with each other. Thus, the silicon-diffusion-resistant conductive layer 26 of the capacitor contact 18 is not oxidized to have a larger resistance in an oxidation ambient during deposition of the BST film 60 even if a misalignment occurs between the capacitor contact 18 and the bottom electrode 56.

In other words, even if the bottom electrode 56 has a misalignment to the accurate position with respect to the capacitor contact 18, the function of the stacked capacitor is not impaired so long as the electric connection is assured between the bottom electrode 56 and the capacitor contact 18. Thus, the allowable margin for patterning is enlarged, and the design margin can be reduced to substantially zero, or below 0.02 $\mu$m, thereby improving the productivity and yield of the product.

For example, if the minimum design width F is 0.18 $\mu$m and the design margin M is 0.05 $\mu$m in the conventional device, the area for the unit cell of the conventional DRAM is $8 \times (F+M)^2 = 0.42$ $\mu m^2$. On the other hands, since the design margin M can be decreased below 0.02 $\mu$m in the present embodiment, the area for the unit cell can be reduced down to $8 \times (F+M)^2 = 0.32$ $\mu m^2$, which is 76% of the conventional unit area. Thus, a suitable configuration can be obtained for higher integration and finer patterning of the DRAM.

Referring to FIGS. 11A to 11D, there are shown consecutive steps of a process for manufacturing the DRAM of FIG. 8. First, a MOSFET is formed on each isolated region of a p-type silicon substrate 12, before the step of FIG. 11A, by forming gate oxide film 33, gate electrode 34, n-type diffused regions 36 using a well-known technique. In this process, after the gate electrode 34 of the MOSFET 14 is formed, a 50-nm-thick silicon nitride ($Si_3N_4$) film 54 is formed on the top and side surfaces of the gate electrode 34, as shown in FIG. 9.

Figure 11A:
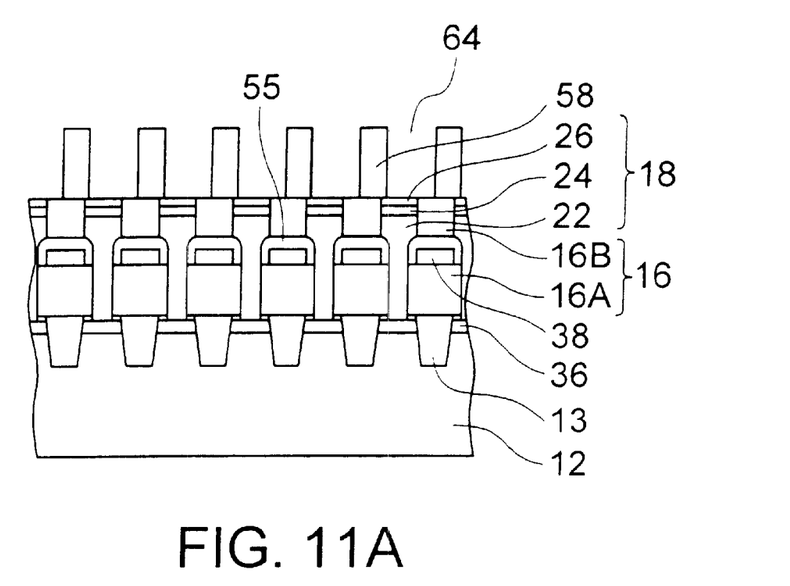
FIGS. 11A to 11D are cross-sectional views of the DRAM of FIG. 8 for illustrating consecutive steps of fabrication thereof.

Thereafter, a two-layer film 16 including a 100-nm-thick $Si_3N_4$ film 16A and a 200-nm-thick $SiO_2$ film 16B, as shown in FIG. 11A, is formed by a known technique. Between the $Si_3N_4$ film 16A and the $SiO_2$ film 16B, bit lines 38 and a $Si_3N_4$ film 55 are formed consecutively.

Thereafter, a capacitor contact 18 including a polysilicon plug 22, a silicide contact layer 24 made of $TiSi_2$ and a silicon-diffusion-resistant conductive layer 26 is formed in each via hole, similarly to the conventional DRAM. In this step, the capacitor contact 18 is selfaligned onto the n-type diffused region 36 in the direction normal to the word lines 82 due to the presence of the silicon nitride film 54 disposed on the gate electrode 33, as shown in FIG. 9. The capacitor contact 18 also penetrates the two-layer film 16 in the direction normal to the bit lines 38 at the space between the bit lines 38 by a self-alignment manner due to the presence of the silicon nitride film 55 disposed on the bit lines 38.

Subsequently, a 300-nm-thick BPSG is deposited by a CVD process to form an interlayer silicone oxide film 58, followed by patterning thereof to form an opening 64 having a size of 0.28 $\mu$m×0.6 $\mu$m and exposing the top of the capacitor contact 18 at a portion of the bottom of the opening 64, as shown in FIG. 11A. The opening 64 is used hereinafter as a region for forming the stacked capacitor. The width of the opening 64 shown in FIG. 11A is selected to be larger than the sum of the thicknesses of the bottom electrode 56 and the capacitor dielectric film 60. The opening of the mask for patterning the opening 64 may be 0.22 $\mu$m×0.62 $\mu$m which is smaller than the size of the bottom electrode 56. In FIG. 11A, the opening 64 for forming the stacked capacitor is shown slightly mis-aligned to the center of the capacitor contact 18 for emphasizing the feature of the present invention.

Figure 11B:
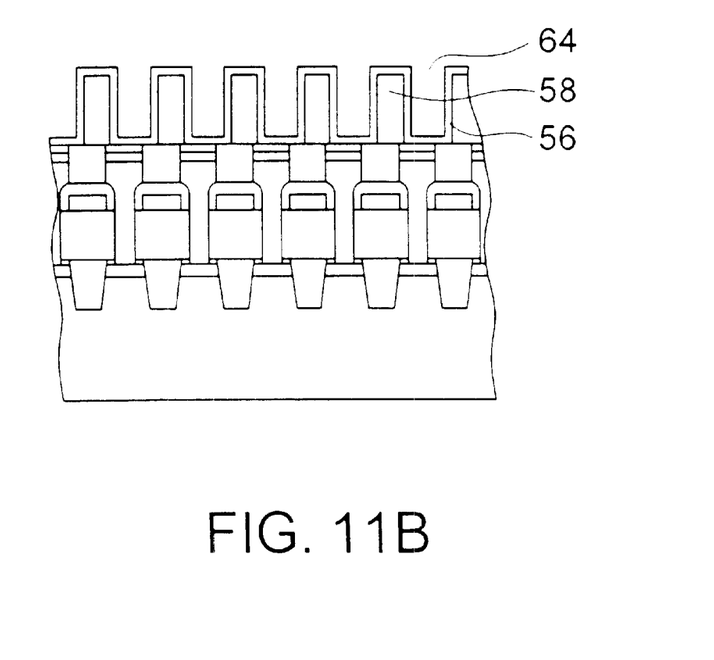
Figure 11C:
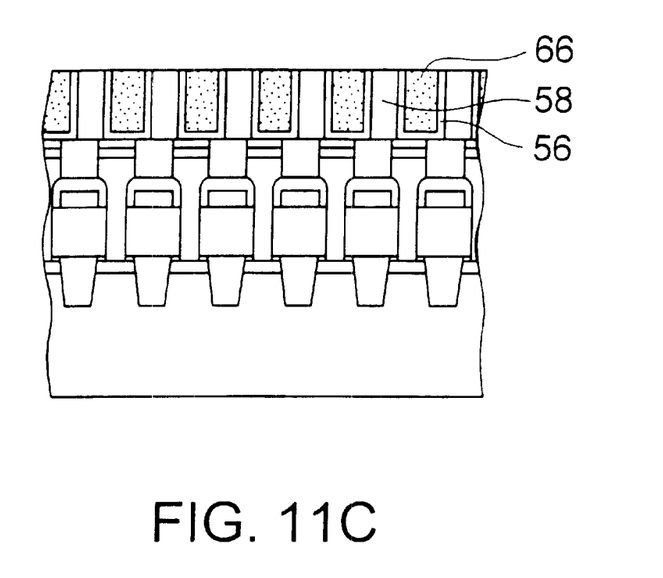
Figure 11D:
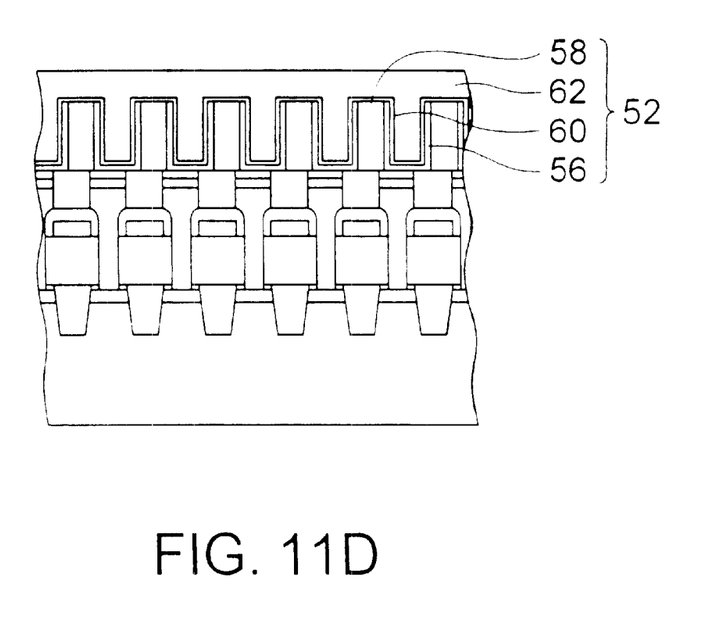

Thereafter, a 30-nm-thick oxidation-resistant metallic film such as Ru film is deposited on the entire surface of the interlayer silicon oxide film 58 by a CVD or sputtering technique, as shown in FIG. 11B, to form a cylindrical shape of a thin conductive film 56 in each opening 64. Then, as shown in FIG. 11C, the top portion of the oxidation-resistant metallic film 56 disposed on the top portion of the interlayer silicon oxide film 58 is subjected to CMP process, after filling inside of the container of the conductive film 56 with a resist film 66, to obtain separate bottom electrodes 56 in respective openings 64. Thus, each resultant bottom electrode 56 has a cylindrical shape, as shown in FIG. 11C.

Subsequently, the resist film 66 is removed, followed by deposition of BST by a CVD process to form a 20-nm-thick capacitor dielectric film 60 and deposition of Ru to form a 100-nm-thick top electrode 62. Thus, the DRAM of the present embodiment can be obtained.

Figure 12:
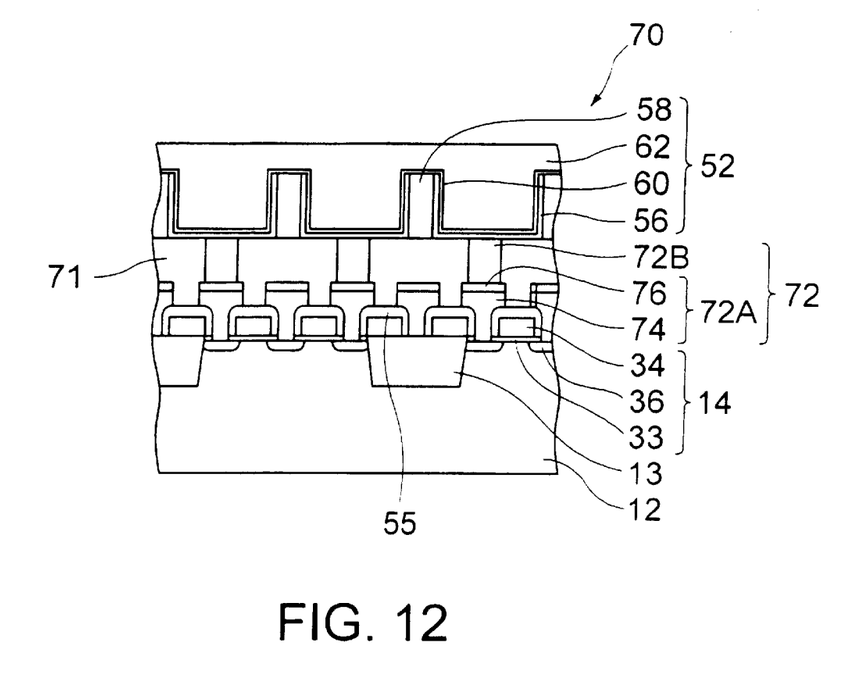
FIG. 12 is a cross-sectional view of a DRAM according to a second embodiment of the present invention taken along a line corresponding to line A—A in FIG. 8.
Figure 13:
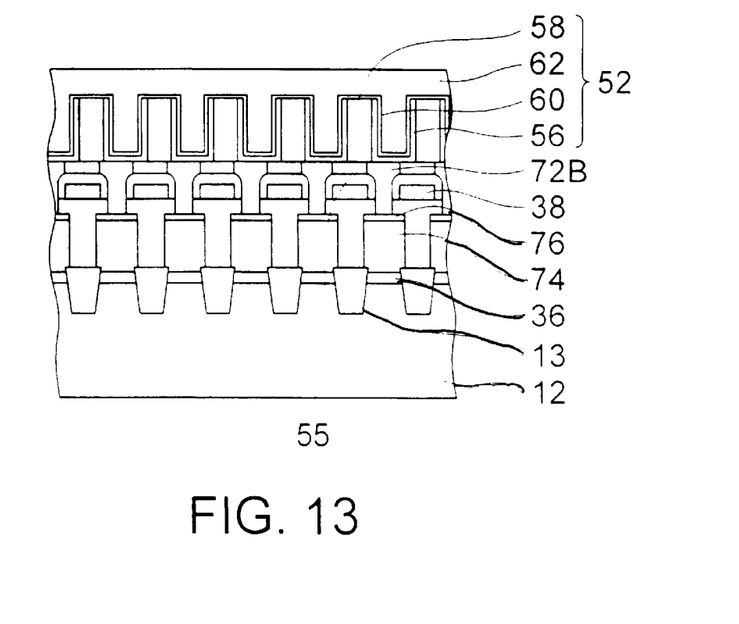
FIG. 13 is a cross-sectional view of the DRAM of FIG. 12 taken along a line corresponding to line A—A in FIG. 8.

FIGS. 12 and 13 show a DRAM according to a second embodiment of the present invention, with the top plan view of the DRAM of the present embodiment shown by FIG. 1. The DRAM of the present embodiment, generally designated by numeral 70, is similar to the first embodiment except for the configuration of the capacitor contact.

The capacitor contact 72 in the present embodiment includes a first contact plug 72A and a second contact plug 72B disposed thereon and in alignment therewith in the vertical direction. The first contact plug 72A includes a body portion made of polysilicon and formed as a contact pad 74 in contact with the n-type diffused region 36 of the MOSFET 14, and a top $TiSi_2$ layer 76 formed on top of the body portion 74 as a silicide contact layer. The second contact plug 72B is made of TiN, acts as a silicon-diffusion-resistant conductive layer and has a diameter slightly smaller than the diameter of the first contact plug 72A. The second contact plug 72B is in direct contact with the first contact plug 72A at the bottom and with the bottom electrode 56 of the capacitor 52 at the top.

The DRAM 70 of the present embodiment achieves an advantage of simple process wherein the bit contact 57 is formed in the same step of forming the first contact plug 72A in addition to the advantages similar to those of the first embodiment.

Figure 14A:
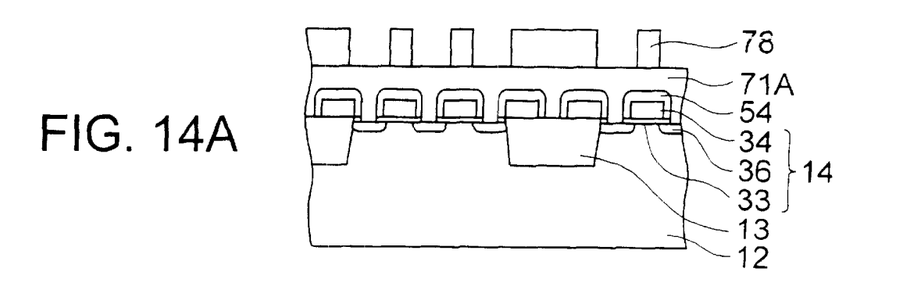
FIGS. 14A to 14F are cross-sectional views of the DRAM of FIG. 12 for illustrating consecutive steps of fabrication thereof.

Referring to FIGS. 14A to 14F, there are shown consecutive steps of fabrication of the second embodiment. MOSFETs 14 are formed on a p-type silicon substrate 12 similarly to the first embodiment. A 50-nm-thick silicon nitride ($Si_3N_4$) film 54 is also formed on the top and side surfaces of the gate electrode 34 during the step of forming the gate electrode 34, as shown in FIG. 14A.

Figure 14B:
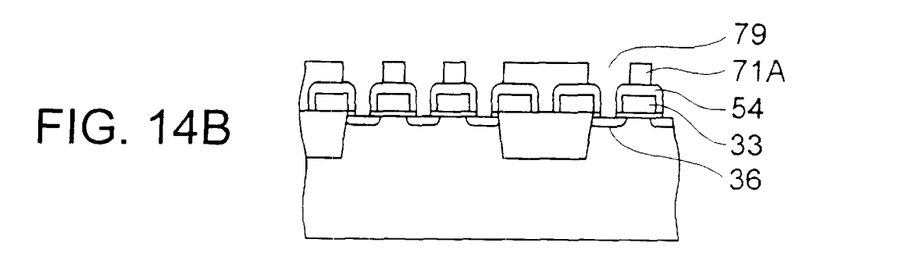

Thereafter, a first interlayer silicon oxide film 71A is formed on the gate structure of the MOSFET 14 as a bottom portion of the interlayer silicon oxide film 71. Subsequently, an etching mask 78 having a mask pattern of via holes is formed on the first interlayer silicon oxide film 71A. Then, as shown in FIG. 14B, the first interlayer silicon oxide film 71A is subjected to patterning using the mask 78 to form via holes 78. In this step, due to the presence of the silicon nitride film 54 provided on the gate electrode 33, the via hole 78 can be positioned by a self-alignment manner in the direction normal to the word lines 82 so that the via hole 78 exposes the diffused region 36 of the MOSFET 14.

Figure 14C:
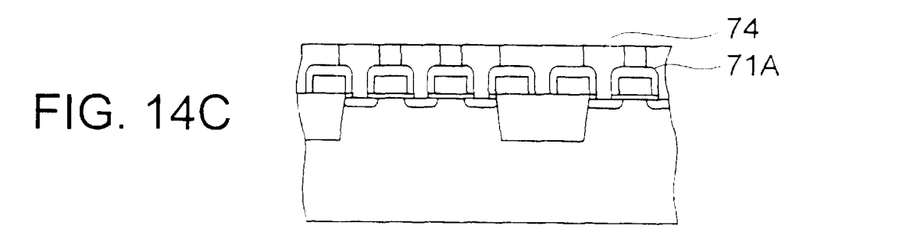

Thereafter, a polysilicon film having a thickness of 200 to 400 nm is deposited to fill the via holes 79, followed by an etch-back or CMP process to remove the polysilicon film to expose the first interlayer silicon oxide film 71A and to leave contact pads 74 in the via holes 79, as shown in FIG. 14C. In this step, the contact pad 74 of the capacitor contact 72 and the bit contact 57 can be formed at the same time.

Figure 14D:
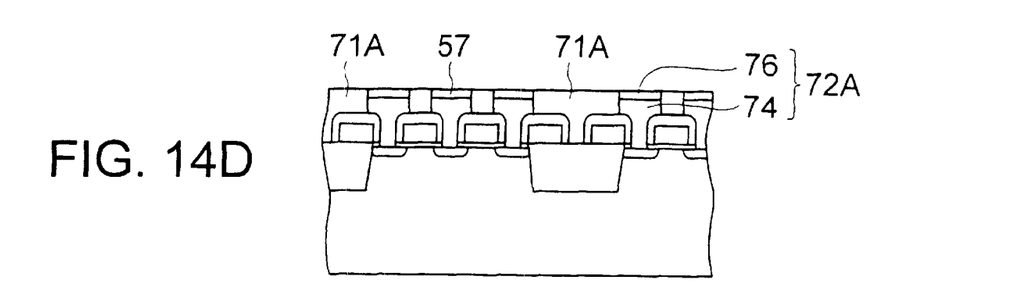

Subsequently, Ti is sputtered onto the entire surface, followed by RTA thereof in a nitrogen ambient to react the top portions of the contact pad 74 with the bit contact 57 to form titanium silicide therefrom. After removing the Ti film remaining on the first interlayer silicon nitride film 71A, a contact layer 76 made of $TiSi_2$ is formed in the via hole 79, as shown in FIG. 14D. Thus, the first contact plug 72A and the bit contact 57 can be obtained.

Figure 14E:
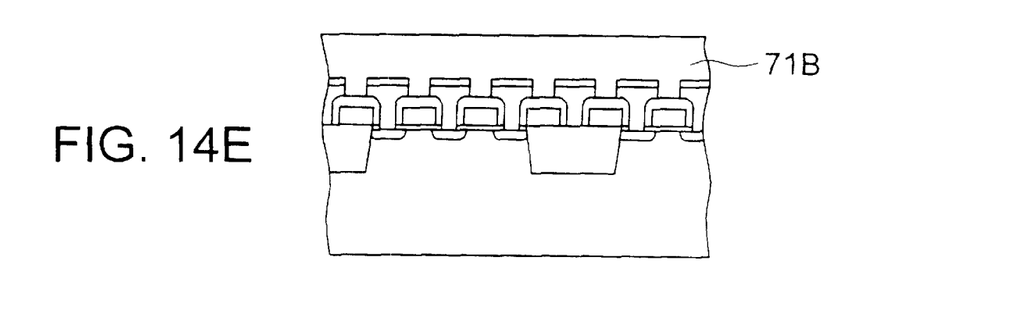
Figure 14F:
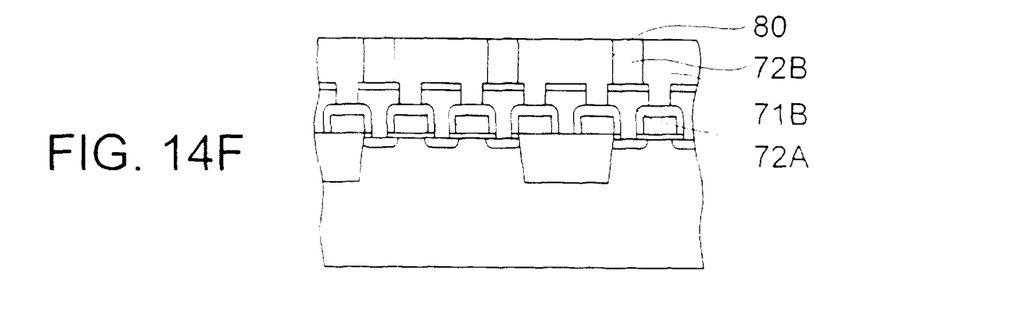

Thereafter, a second interlayer silicon nitride film 71B is deposited on the entire surface, and as shown in FIG. 14E, second via holes 80 are formed in the second interlayer silicon oxide film 71B in alignment with the first contact plug 72A by a photolithographic and etching technique. Then, a TiN film is deposited thereon by a sputtering or CVD technique, followed by an etch-back or CMP process of the TiN film to expose the second interlayer silicon oxide film 71B and leave the TiN film in the second via holes 80 as the silicon-diffusion-resistant conductive layer or second contact plug 72B. Finally, a capacitor 52 is formed on the second contact plug 72B of the capacitor contact 72, similarly to the first embodiment, to achieve the DRAM 70 of the present embodiment.

The cylindrical-shape bottom electrode 56 in the present invention may have any shape such as a cylinder having an open top and a closed bottom, or a hexahedron having an open top. The hexahedron may be oblong or square as viewed in the vertical direction. The thickness or height of the bottom electrode 56 is not limited to any size.

The capacitor dielectric film 60 preferably has a high dielectric constant or permittivity. At least a portion of the capacitor dielectric film 60 may be made of a compound expressed in: a general formula $ABO_3$, wherein A is selected from one or more of elements Ba, Sr, Pb, Ca, La, Li and K, and B is selected from one or more of elements Zr, Ti, Ta, Nb, Mg, Mn, Fe, Zn and W; a general formula $(Bi_2O_2)(A_{m-1}B_mO_{3m+1})$ wherein m=1, 2, 3, 4 or 5, A is selected from one or more of elements Ba, Sr, Pb, Ca, K and Bi, and B is selected from one or more of elements Nb, Ta, Ti and W; or $Ta_2O_5$.

Examples of the compounds expressed in the general formula $ABO_3$ include $SrTiO_3$, $PbTiO_3$, $(Pb, La)(Zr, Ti)O_3$, $Pb(Mg, Nb)O_3$, $Pb(Mg, W)O_3$, $Pb(Zn, Nb)O_3$, $LiTaO_3$, $LiNbO_3$, $KTaO_3$ and $KNbO_3$.

Examples of the compounds expressed in the general formula $(Bi_2O_2)(A_{m-1}B_mO_{3m+1})$ wherein M=1, 2, 3, 4 or 5 include $Bi_4Ti_3O_{12}$, $SrBi_2Ta_2O_9$ and $SrBi_2Nb_2O_9$.

The bottom electrode is preferably made of an oxidation-resistant conductor. Examples of the oxidation-resistant conductors include one of more of metals and metal oxides including Pt, Ru, Ir, $RuO_2$ and $IrO_2$. The silicon-diffusion-resistant conductive layer functions for resisting silicon atoms to diffuse into the conductor to form a silicide. Examples of materials for the silicon-diffusion-resistant conductive layer include high-melting-point metals (or refractory metals) such as Ti, Co, W and Ni and nitrides of such metals. The materials for the top electrode may be selected from any conductive materials and may be preferably the same material as used for the bottom electrode.

It does not cause any serious problem to contact the polysilicon plug directly with the silicon-diffusion-resistant layer. However, it is preferable to interpose a silicide contact layer made of metal silicide etc. between the polysilicon plug and the silicon-diffusion-resistant layer for improving the adherence and reducing the contact resistance therebetween. In a preferred embodiment of the present invention, the silicide contact layer is made of $TiSi_2$, the silicon-diffusion-resistant layer is made of TiN and the bottom electrode is made of Ru.

Since the above embodiments are described only for examples, the present invention is not limited to the above embodiments and various modifications or alterations can be easily made therefrom by those skilled in the art without departing from the scope of the present invention.

What is claimed is:

1. A DRAM comprising a plurality of memory cells each including a MOSFET having a gate electrode and a pair of diffused regions, a stacked capacitor having a bottom electrode of a cylindrical shape, a top electrode, at least a portion of said top electrode being received in said bottom electrode and a capacitor dielectric film sandwiched between said top electrode and said bottom electrode, and a capacitor contact for connecting one of said diffused regions to said bottom electrode, wherein said capacitor contact includes a polycrystalline silicon (polysilicon) plug disposed in direct contact with said one of said diffused regions and a silicon-diffusion-resistant conductive layer disposed in direct contact with said bottom electrode and electrically connected to said polysilicon plug.

2. The DRAM as defined in claim 1, wherein said capacitor contact further includes a silicide contact layer interposed between said polysilicon plug and said silicon-diffusion-resistant conductive layer.

3. A DRAM comprising a plurality of memory cells each including a MOSFET having a gate electrode and a pair of diffused regions, a stacked capacitor having a bottom electrode of a cylindrical shape, a top electrode, at least a portion of said top electrode being received in said bottom electrode and a capacitor dielectric film sandwiched between said top electrode and said bottom electrode, and a capacitor contact for connecting one of said diffused regions to said bottom electrode, wherein said capacitor contact includes a first contact plug disposed in direct contact with said one of said diffused regions and a second contact plug overlying said first contact plug.

4. The DRAM as defined in claim 3, wherein said first contact plug includes silicon, and said second contact plug includes a silicon-diffusion-resistant conductor.

5. The DRAM as defined in claim 4, wherein said capacitor contact further includes a silicide contact layer interposed between said first contact plug and said second contact plug.

6. The DRAM as defined in claim 5, wherein said silicide contact layer includes $TiSi_2$, said second contact plug includes TiN and said bottom electrode include Ru.

7. A DRAM comprising a plurality of memory cells each including a MOSFET having a gate electrode and a pair of diffused regions, a stacked capacitor having a bottom electrode of a cylindrical shape, a top electrode, at least a portion of said top electrode being received in said bottom electrode and a capacitor dielectric film sandwiched between said top electrode and said bottom electrode, and a capacitor contact for connecting one of said diffused regions to said bottom electrode, wherein said bottom electrode includes an oxidation-resistant metal or metal oxide.

8. The DRAM as defined in claim 7, wherein said oxidation-resistant metal or metal oxide includes one or more of Pt, Ru, Ir, $RuO_2$ and $IrO_2$.

9. A DRAM comprising a plurality of memory cells each including a MOSFET having a gate electrode and a pair of diffused regions, a stacked capacitor having a bottom electrode of a cylindrical shape, a top electrode, at least a portion of said top electrode being received in said bottom electrode and a capacitor dielectric film sandwiched between said top electrode and said bottom electrode, and a capacitor contact for connecting one of said diffused regions to said bottom electrode, wherein said capacitor contact includes one or more of refractory metals or nitrides thereof at a top of said capacitor contact.

10. The DRAM as defined in claims 1, 3, 7 or 9, wherein said capacitor dielectric film includes a compound expressed in:

a general formula $ABO_3$, wherein A is selected from one or more of elements Ba, Sr, Pb, Ca, La, Li and K, and B is selected from one or more of elements Zr, Ti, Ta, Nb, Mg, Mn, Fe, Zn and W; a general formula $(Bi_2O_2)(A_{m-1}B_mO_{3m+1})$ wherein m=1, 2, 3, 4 or 5, A is selected from one or more of elements Ba, Sr, Pb, Ca, K and Bi, and B is selected from one or more of elements Nb, Ta, Ti and W; or $Ta_2O_5$.

11. The DRAM as defined in claims 1, 3, 7 or 9, wherein a plurality of said capacitors share single said capacitor dielectric film and single said top electrode, and each said capacitor has dedicated said bottom electrode.

* * * * *